United States Patent [19]

Mochizuki

[11] Patent Number: 5,161,123

[45] Date of Patent: Nov. 3, 1992

[54] SEMICONDUCTOR MEMORY

[75] Inventor: Hidenobu Mochizuki, Kanagawa, Japan

[73] Assignee: Sony Corporation, Tokyo, Japan

[21] Appl. No.: 527,821

[22] Filed: May 24, 1990

[30] Foreign Application Priority Data

May 25, 1989 [JP] Japan .................................. 1-134120

[51] Int. Cl.$^5$ ................................................ G11C 7/00
[52] U.S. Cl. .................................... 365/204; 365/207; 365/233.5
[58] Field of Search ............... 365/185, 205, 207, 208, 365/189.09, 203, 233.5, 204

[56] References Cited

U.S. PATENT DOCUMENTS 4,461,965  7/1984  Chin ................................ 365/205 X
4,477,884 10/1984  Iwahashi et al. ...................... 365/185
4,903,235  2/1990  Kubota ............................ 365/205 X Primary Examiner—Joseph A. Popek
Attorney, Agent, or Firm—Hill, Van Santen, Steadman & Simpson

[57] ABSTRACT

A semiconductor memory comprising a memory cell comprising a MOS transistor connected between a bit line and a reference potential terminal; a sense amplifier coupled to the bit line for reading out a potential on the bit line, the sense amplifier comprising an inverter having an input and output connected to each other via a switch; and a circuit element interposed between the bit line and the sense amplifier operative to only transmit bit line potential changes in a direction of the reference potential.

6 Claims, 3 Drawing Sheets

SEMICONDUCTOR MEMORY

BACKGROUND OF THE INVENTION

The present invention relates to semiconductor memories. More particularly, the invention relates to a memory with a memory cell comprising a MOS transistor connected between a bit line and a reference potential terminal and means for reading out the contents of the memory cell.

The prior art is represented by conventional read only memories (ROMs) that are classifiable into two types: (1) where an ordinary cell and a dummy cell are provided, and a difference in potential between bit lines associated with the dummy cell and the ordinary cell is detected by a differential amplifier; and (2) where no dummy cell is provided, and the bit line potential of the only cell is read out after being amplified by an inverter.

In FIG. 7, there is illustrated a conventional ROM of the first type. In the illustrated circuit diagram, there are included an ordinary cell and a dummy cell. The ordinary cell comprises a MOS transistor Mc having a source coupled to a ground potential Vss and a drain connect to an ordinary bit line. The dummy cell also comprises a MOS transistor Mdc having its source coupled to the ground potential Vss and a drain coupled to a dummy bit line.

A load resistor R1 is connected between the ordinary bit line and a power terminal having an electric potential Vdd. A load resistor R2 is connected between the dummy bit line and the power terminal. A differential amplifier AMP having one input coupled to the ordinary bit line and another input coupled to the dummy bit line effects a comparison between the electric potentials of the bit lines.

In the circuit of FIG. 7, the current driveability of the MOS transistor Mdc serving as the dummy cell normally is set to half the current driveability of the MOS transistor Mc serving as the ordinary cell. Additionally, the load resistor R2 for the dummy bit line can be set to half of the value of the load resistor R1 for the ordinary bit line.

In either case, the potential drop caused in the ordinary bit line by the flow of a current in the ordinary cell is faster than that in the dummy bit line. This is illustrated in FIG. 8 wherein there is included a graph illustrating how the various bit line potentials of the memory of FIG. 7 vary over time. Under the conditions including the sensitivity of ΔV of the amplifier AMP and the time t required for inducing a potential difference ΔV between the dummy bit line and the ordinary bit line, it follows that the time t is required for identifying the state of the memory cell.

In FIG. 9 there is illustrated a conventional ROM of the second type including a sense amplifier that amplifies the bit line potential via an inverter without the provision of a dummy cell. In the circuit diagram of FIG. 9, there is included an inverter In and a load resistor R connected between the ordinary bit line and the power terminal. The electric potential of the bit line is read out via the inverter In.

In FIG. 10 there is provided a graph illustrating how the potential in the bit line of the semiconductor memory of FIG. 9 varies over time. It can be appreciated that in this circuit, when a current flows in the memory cell, the time required for reading out the potential is rendered longer by the time period t needed for the bit-line potential to traverse the threshold voltage of the inverter In after initiation of its change.

There exists a great demand for increasing the read out speed of a semiconductor memory such as a ROM. However, it has been difficult heretofore to completely meet such demand by either of the circuits described in FIGS. 7 and 9.

In the circuit of FIG. 7, instead of a direct detection of the rapid potential change in the ordinary bit line current flow through in the cell, there is executed a detection of the potential difference between the ordinary bit line and the dummy bit line where the potential change in speed is as low as half the value in the ordinary bit line, so that the time required for reading out such potential change is rendered twice that as is the case of direct detection, should the sensitivity of the amplifiers be the same.

In the circuit of FIG. 9, a considerable amount of time is needed to execute a memory read out.

SUMMARY OF THE INVENTION

The present invention provides an improved semiconductor memory. To that end, the present invention provides a semiconductor memory capable of quickly detecting potential changes on a bit line of a memory cell.

In an embodiment, the invention provides a semiconductor memory with a sense amplifier comprising an inverter whose input and output are connected to each other by switching means, and potential-change transmitting means interposed between the bit line and the inverter so as to transmit to the inverter a bit line potential change in the direction of a reference potential to which the memory cell is coupled, preferably ground.

According to the invention, the input level of the inverter can be biased to its threshold voltage by momentarily turning on the switching means before the start of a memory read operation. When the bit line reference potential is changed after the memory cell is placed in its "on" state to cause flow of a current, the input level of the inverter is changed from the threshold voltage toward the reference potential so that the inverter is immediately set for generating an output signal corresponding to the stored content of the memory cell. Consequently, it is possible to shorten the time required for achieving an identifiable state of the memory cell and, hence, to attain an improvement in acceleration of the read operation.

These and other features and advantages will become apparent with reference to the following detailed description of the presently preferred embodiments and accompanying drawings.

DETAILED DESCRIPTION OF THE PRESENTLY PREFERRED EMBODIMENTS

In accordance with the invention, a semiconductor memory is constructed so as to provide an increased read out speed of its content. To that end, a semiconductor memory is provided with an inverter having an input coupled to a bit line of the memory, the inverter including an output coupled to the input via a switch. Further, an element capable of transmitting changes in potential only is interposed between the input of the inverter and the bit line so that only potential changes are transmitted to the inverter.

Figure 1:
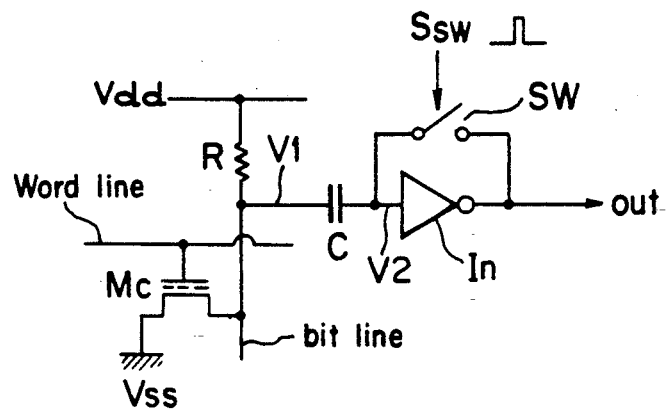
FIG. 1 is a circuit diagram illustrating a first semiconductor memory embodying principles of the invention.
Figure 2:
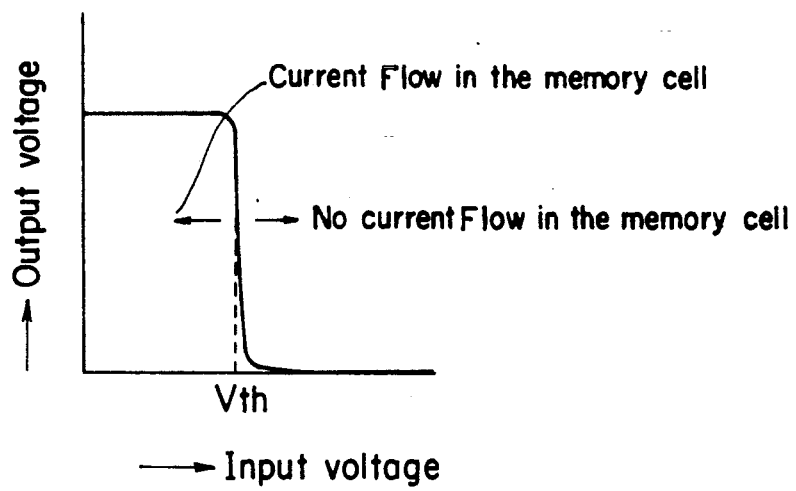
FIG. 2 is a graph illustrating input and output characteristics of an inverter employed in the semiconductor memory of FIG. 1
Figure 3:
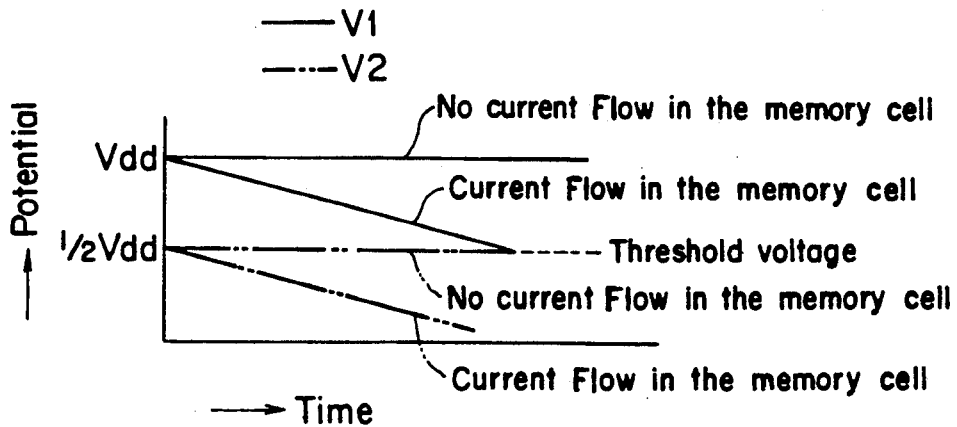
FIG. 3 is a graph illustrating variations in memory cell potentials over time to explain operation of the memory of FIG. 1.

FIGS. 1–3 illustrate a first semiconductor memory constructed according to the present invention. FIG. 1 is a circuit diagram of the principal components of the semiconductor memory. FIG. 2 is a graph illustrating input-output characteristics of an inverter used in the semiconductor memory of FIG. 1. FIG. 3 is a graph illustrating how potential changes occur in a bit line and the inverter input of the semiconductor memory of FIG. 1.

Figure 9:
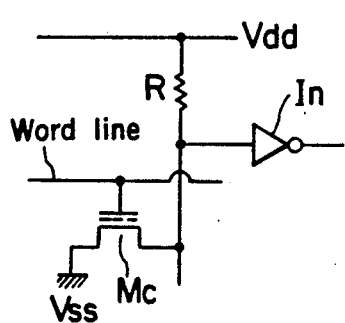
FIG. 9 is a circuit diagram of another conventional semiconductor memory.

In the semiconductor memory of FIG. 1, an inverter has an input coupled to a bit line of the memory cell so as to serve as a sense amplifier. As illustrated, input and output terminals of the inverter are coupled together via a switching means SW. A capacitive element C is interposed between the input terminal of the inverter In and the bit line. In all other respects, the illustrated semiconductor memory is substantially similar to the conventional memory described in connection with FIG. 9.

In this first semiconductor memory, the switching means SW is momentarily turned on before the start of a memory read operation by a signal Ssw generated in response to an address transition detection signal. When the switching means SW is momentarily turned on (i.e. switch closed), the input and output terminals of the inverter In are short-circuited by the switching means SW so that a potential V2 at the input terminal of the inverter In is substantially equal to a threshold voltage Vth of the inverter In. The inverter threshold voltage Vth can be equal to, for example, ½ Vdd.

When a word signal is input in this state via application of a signal to the gate of the transistor Mc, a current flows in the memory cell. The current flows from the resistor R1 to ground through the transistor Mc. As a result, a potential V1 on the bit line is lowered because the bit line is coupled to ground. This in turn causes a reduction of the input potential V2 of the inverter In from the threshold voltage Vth. Consequently, the output of the inverter In is immediately changed to be at the level of the state of the memory cell (to a high level when the cell is turned on), whereby the reading operation can be expedited.

Figure 7:
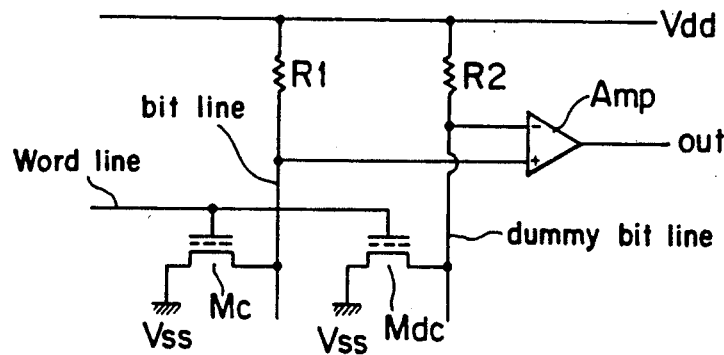
FIG. 7 is a circuit diagram of a conventional semiconductor memory.
Figure 8:
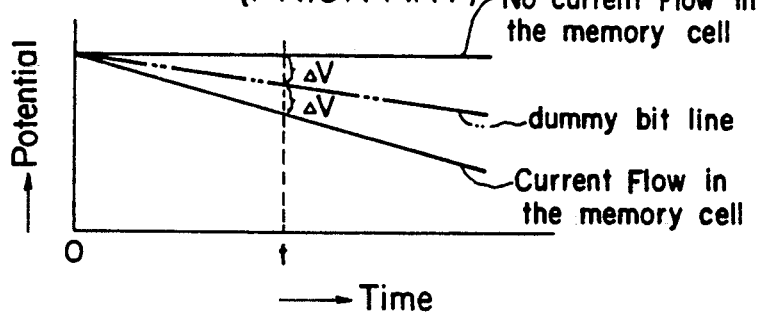
FIG. 8 is a graph illustrating how a bit line potential of the memory of FIG. 7 varies over time.
Figure 10:
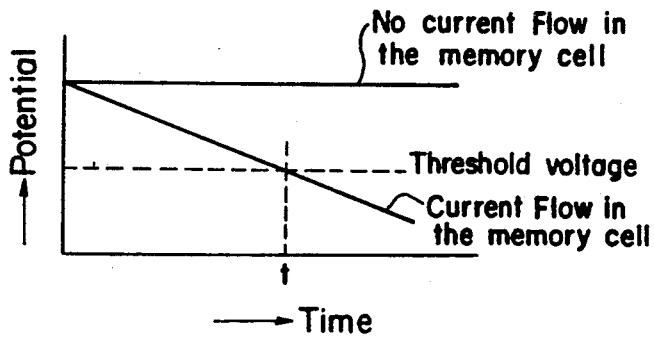
FIG. 10 is a graph illustrating how a bit line potential of the memory of FIG. 9 varies over time.

In contrast to the conventional semiconductor memory of FIG. 7, the semiconductor memory of FIG. 1 is constructed so that the level of the bit line potential is detected directly thereby eliminating any read out delay present in the detection of the difference between the potentials of the dummy and ordinary bit lines. Furthermore, the input of the inverter In is biased to its threshold voltage Vth prior to the start of the reading operation so that when the bit line potential is reduced by a current flowing in the memory cell, such change in potential is transmitted immediately to the inverter In via the capacitive element C, because the potential drop at the input terminal of the inverter In commences not from the level of the supply voltage Vdd but from the level of threshold voltage Vth, which is less than the voltage Vdd. Accordingly, in comparison with the conventional semiconductor memory of FIG. 9, where the input level of the inverter is changed from the level of the supply voltage Vdd, the required reading time can be shorted by the time period t illustrated in FIG. 10 via use of the structure provided by the invention.

Figure 4:
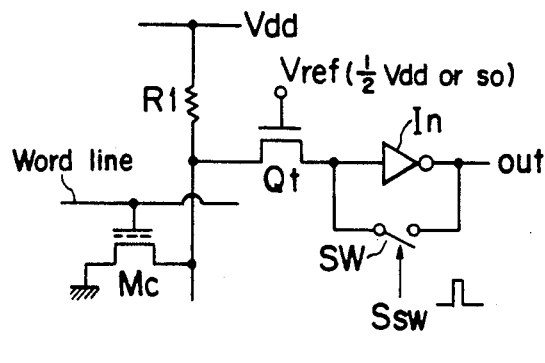
FIG. 4 is a circuit, diagram of a second semiconductor memory embodying principles of the invention.

In FIG. 4 there is illustrated a circuit diagram of a second semiconductor memory embodying principles of the invention. In this second semiconductor memory, a MOS transistor Qt is used as the potential change transmitting means instead of the capacitive element C. Accordingly, the transistor Qt is used to transmit bit line potential changes in the direction of the ground potential Vss to the inverter In. A potential corresponding to substantially ½ Vdd (for example, 2 to 3 volts when Vdd is 5 volts) is continuously applied to the gate of the MOS transistor Qt.

In this second semiconductor memory, the switching means SW is momentarily turned on before the start of a reading operation so that the input level V2 of the inverter In is lowered to the threshold voltage of the inverter In, about one-half the level of Vdd. Such a momentary turn on signifies that the switching means SW is turned off immediately thereafter. However, the MOS transistor Qt is in its off state by turn off of the switching means SW and therefore the bit line and inverter In are electrically disconnected from each other by the MOS transistor Qt so that the input level V2 of the inverter In is continuously held at the threshold voltage Vth (about one-half Vdd).

Subsequently, when the bit line potential is reduced from the Vdd level after conduction of the memory cell in response to the arrival of the word signal, the MOS transistor Qt is turned on to perform its amplifying operation, thereby quickly reducing the input level V2 of the inverter In from the threshold value Vth. Consequently, the output of the inverter In is made to conform to the state of the memory cell.

In this second semiconductor memory, the input side of the inverter In is prevented from floating, so that circuit operation is further stabilized, in contrast to the conventional semiconductor memory of FIG. 1.

Figure 5:
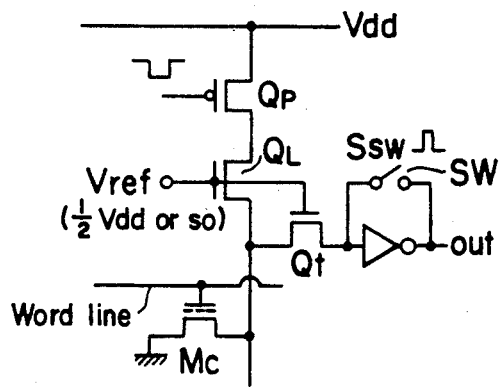
FIG. 5 is a circuit diagram of a third semiconductor memory embodying principles of the invention.

FIG. 5 illustrates a circuit diagram of a third semiconductor memory embodying principles of the invention. In this third semiconductor memory, a load comprising a MOS transistor QL which receives at its gate a voltage Vref that approximates the threshold voltage Vth of the inverter In. A further pull-up MOS transistor QP is also provided. In all other respects, the third semiconductor memory of FIG. 5 is the same as the second semiconductor memory of FIG. 4.

Figure 6:
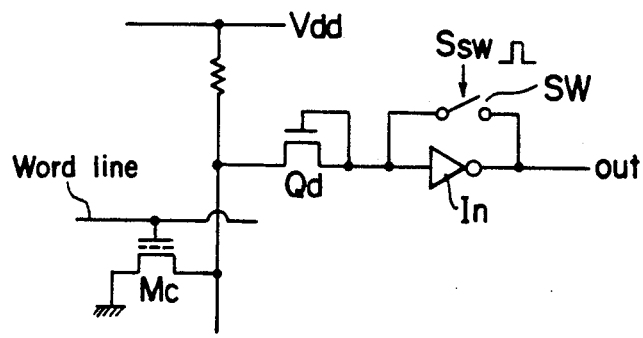
FIG. 6 is a circuit diagram of a fourth semiconductor memory embodying principles of the invention.

FIG. 6 is a circuit diagram that illustrates a fourth semiconductor memory embodying principles of the invention. In the fourth semiconductor memory, a junction diode is used as the potential change transmitting means. To this end, a MOS transistor Qd is connected between the memory cell bit line and the inverter In, and its gate is connected to an anode of the MOS transistor Qd and the inverter In. The MOS transistor Qd substantially functions as a diode whose anode and cathode are on the inverter side and the bit line side, respectively.

In this fourth semiconductor memory, if the switching means SW is turned on to bias the input level of the inverter In to the inverter threshold voltage Vth and then is immediately turned off, the bit line will be at the Vdd level and therefore the diode comprising the MOS transistor Qd will be turned off. Consequently, the input level of the inverter In remains unchanged at the threshold level Vth.

When the bit line potential is reduced after the start of a read operation, the diode turns on to reduce the input potential of the inverter In from the threshold voltage Vth. In this manner, the read operation is expedited.

In view of the foregoing, it can be appreciated that the invention can be carried out in a variety of constructions. Accordingly, many modifications of the illustrated semiconductor memories can be construed while still falling within the scope of the invention.

As described above, in a semiconductor memory where a memory cell is composed of a MOS transistor connected between a bit line and a reference potential terminal, the present invention provides a sense amplifier comprising an inverter whose inputs and outputs are connected to each other by switching means, and potential change transmitting means is interposed between the input terminal of the inverter and the bit line so as to transmit only a bit line potential change in the direction of the reference potential. Therefore, according to the invention, the input level of the inverter can be biased to its threshold voltage by turning on the switching means before the start of a reading operation. When the bit line reference potential is changed after the memory cell is placed in its on state to cause flow of a current, the input level of the inverter is changed from the threshold voltage to the reference potential so that the inverter is immediately or nearly immediately placed in a state corresponding to the stored content of the memory cell. Consequently, it becomes possible to shorten the time required for achieving a discernible state of the memory cell, hence attaining a remarkable improvement in acceleration of the read operation.

While a preferred embodiment has been shown, modifications and changes may become apparent to those skilled in the art which shall fall within the spirit and scope of the invention. It is intended that such modifications and changes be covered by the attached claims.

What is claimed is:

1. A semiconductor memory comprising:
   a bit line;
   a word line;
   a memory cell comprising a MOS transistor operatively connected between said bit line and said word line;
   a sense amplifier coupled to said bit line, said sense amplifier comprising an inverter with an input coupled to said bit line and a switch coupled between said input and an output of said inverter, said switch operatively controlled so as to momentarily close prior to every read out of said bit line in response to an address transition signal to thereby place said output and said input at the same potential; and
   means for coupling said input of said inverter and said bit line transmitting only a change in potential on said bit line caused by current flow in said MOS transistor.

2. The semiconductor memory of claim 1, wherein said means includes a capacitive element coupled between said bit line and said inverter input.

3. The semiconductor memory of claim 1, wherein said means includes a MOS transistor coupled between said bit line and said inverter input.

4. The semiconductor memory of claim 1, wherein said means includes a junction diode coupled between said bit line and said inverter input.

5. The semiconductor memory of claim 1, wherein said means transmits a potential change on said bit line only when the change is in the direction of a reference potential.

6. A method for reading out information from a memory cell comprising a MOS transistor coupled between a bit line and a word line, comprising the steps of:
   providing an inverter coupled to said bit line which inverter includes a switch coupled between an input and an output thereof;
   momentarily directly coupling said input of said inverter to said output of said inverter just prior to reading out of said memory cell in response to a memory address transition signal, thereby to ensure that the potential of the inverter output is equal to the potential at the input of the inverter just prior to memory cell read out; and
   transmitting to said inverter only changes in potential on said bit line caused by current flow in said MOS transistor.

* * * * *